(12) United States Patent
Pinkerton et al.

(10) Patent No.: US 9,924,275 B2
(45) Date of Patent: Mar. 20, 2018

(54) LOUDSPEAKER HAVING ELECTRICALLY CONDUCTIVE MEMBRANE TRANSDUCERS

(71) Applicant: CLEAN ENERGY LABS, LLC, Austin, TX (US)

(72) Inventors: Joseph F. Pinkerton, Austin, TX (US); David A. Badger, Lago Vista, TX (US); William Neil Everett, Cedar Park, TX (US); William Martin Lackowski, Austin, TX (US)

(73) Assignee: Clean Energy Labs, LLC, Austin, TX (US)

( * ) Notice: Subject to any disclaimer, the term of this patent is extended or adjusted under 35 U.S.C. 154(b) by 0 days.

(21) Appl. No.: 15/017,452

(22) Filed: Feb. 5, 2016

(65) Prior Publication Data

US 2016/0234603 A1    Aug. 11, 2016

Related U.S. Application Data

(60) Provisional application No. 62/113,235, filed on Feb. 6, 2015.

(51) Int. Cl.
| | |
|---|---|
| *H04R 19/02* | (2006.01) |
| *H04R 7/04* | (2006.01) |
| *H04R 1/24* | (2006.01) |
| *H04R 31/00* | (2006.01) |
| *H04R 3/12* | (2006.01) |
| *H04R 29/00* | (2006.01) |

(Continued)

(52) U.S. Cl.
CPC ............. *H04R 19/02* (2013.01); *H03F 3/217* (2013.01); *H04R 1/24* (2013.01); *H04R 1/26* (2013.01); *H04R 1/288* (2013.01); *H04R 1/2896* (2013.01); *H04R 1/345* (2013.01); *H04R 1/403* (2013.01); *H04R 3/06* (2013.01); *H04R 3/12* (2013.01); *H04R 7/02* (2013.01); *H04R 7/04* (2013.01); *H04R 9/06* (2013.01); *H04R 29/002* (2013.01); *H04R 31/003* (2013.01); *H03F 2200/03* (2013.01); *H04R 3/002* (2013.01); *H04R 2207/00* (2013.01); *H04R 2307/023* (2013.01); *H04R 2307/025* (2013.01); *H04R 2499/11* (2013.01)

(58) Field of Classification Search
CPC .................................................... H04R 19/02
See application file for complete search history.

(56) References Cited

U.S. PATENT DOCUMENTS

| | | | | |
|---|---|---|---|---|
| 3,008,013 | A * | 11/1961 | Walker | H04R 19/02 381/116 |
| 3,136,867 | A * | 6/1964 | Brettell | H04R 19/02 381/116 |

(Continued)

*Primary Examiner* — Mark Fischer
(74) *Attorney, Agent, or Firm* — Dickinson Wright PLLC; Ross Spencer Garsson

(57) ABSTRACT

An improved loudspeaker having pump cards that include an array of electrically conductive membrane transducers (such as polyester-metal membrane pumps). The array of electrically conductive membrane transducers combine to generate the desired sound by the use of pressurized airflow. The array of electrically conductive membranes has a total membrane area that is at least five times larger than the face area of the loudspeaker. In some embodiments, the loudspeaker includes a dynamic DC bus controller that maintains the DC bus level slightly above the inverter output (audio signal).

11 Claims, 20 Drawing Sheets

(51) Int. Cl.
*H04R 9/06* (2006.01)
*H04R 3/06* (2006.01)
*H04R 1/28* (2006.01)
*H03F 3/217* (2006.01)
*H04R 1/26* (2006.01)
*H04R 1/34* (2006.01)
*H04R 1/40* (2006.01)
*H04R 7/02* (2006.01)
*H04R 3/00* (2006.01)

(56) References Cited

U.S. PATENT DOCUMENTS

| | | | | |
|---|---|---|---|---|
| 3,943,304 | A * | 3/1976 | Piribauer | H04R 1/24 381/182 |
| 3,989,909 | A * | 11/1976 | Hodsdon | H04R 1/023 181/175 |
| 4,005,278 | A * | 1/1977 | Gorike | H04R 5/033 181/137 |
| 5,898,340 | A * | 4/1999 | Chatterjee | H03F 3/2171 330/251 |
| 2006/0202760 | A1 * | 9/2006 | Simon | H03F 1/223 330/254 |
| 2007/0189559 | A1 * | 8/2007 | Haan | H04R 19/02 381/191 |
| 2013/0223651 | A1 * | 8/2013 | Hoyerby | H03F 3/2173 381/120 |
| 2016/0050492 | A1 * | 2/2016 | Holman | H04R 3/06 381/120 |

* cited by examiner

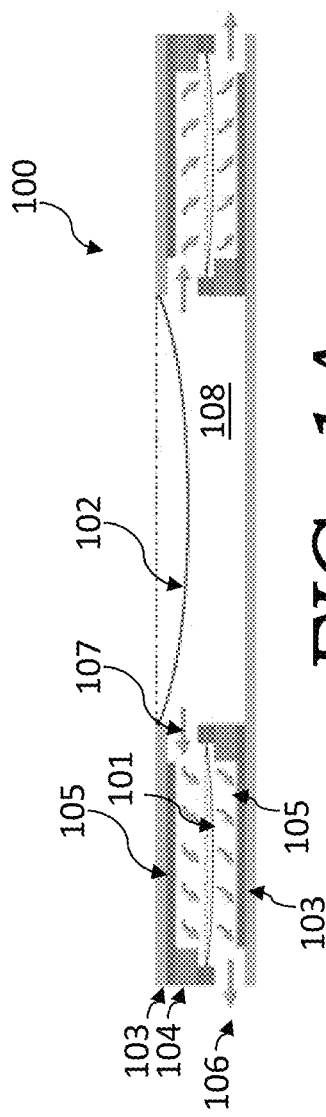
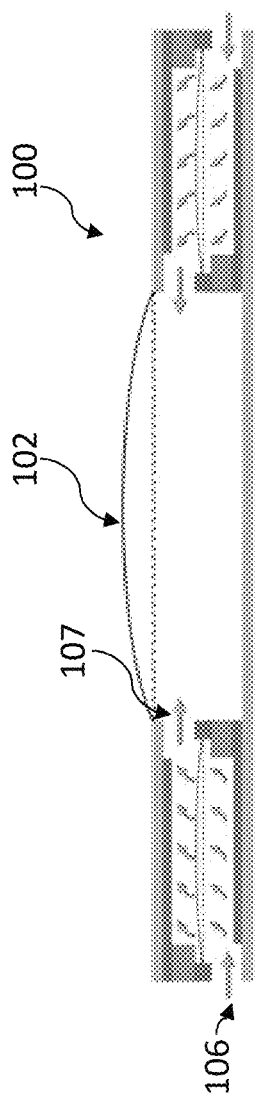

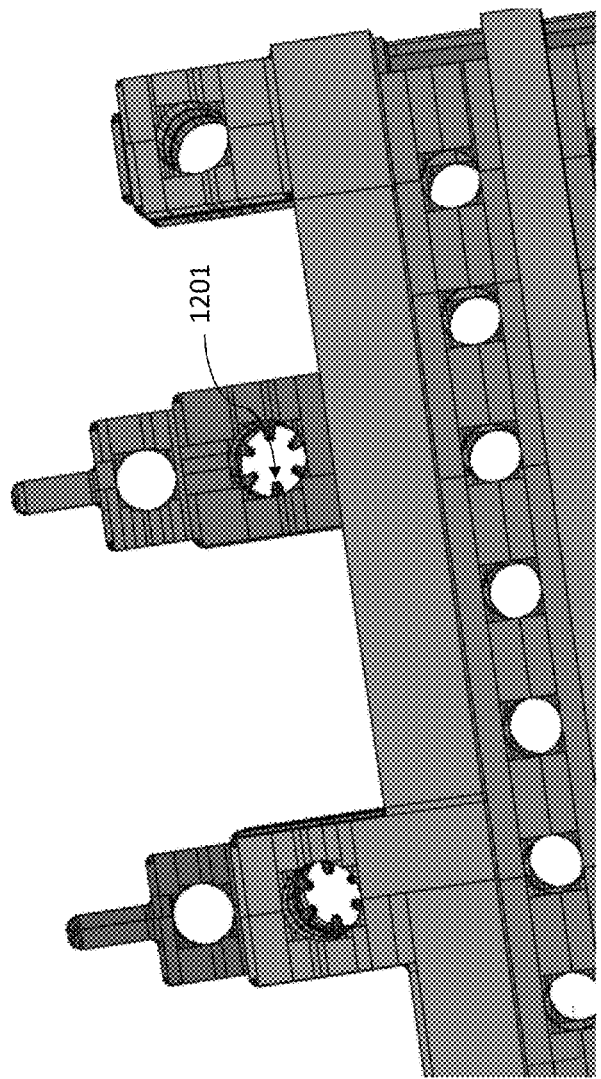

US 9,924,275 B2

LOUDSPEAKER HAVING ELECTRICALLY CONDUCTIVE MEMBRANE TRANSDUCERS

RELATED PATENT APPLICATIONS

This application claims priority to provisional U.S. patent application Ser. No. 62/113,235, filed on Feb. 6, 2015, entitled "Loudspeaker having Electrically Conductive Membrane Transducer."

This application is also related to U.S. patent application Ser. No. 14/309,615, filed on Jun. 19, 2014 (the "Pinkerton '615 application"), which is a continuation-in-part to U.S. patent application Ser. No. 14/161,550, filed on Jan. 22, 2014. This application is also related to U.S. patent application Ser. No. 14/047,813, filed Oct. 7, 2013, which is a continuation-in-part of International Patent Application No. PCT/2012/058247, filed Oct. 1, 2012, which designated the United States and claimed priority to provisional U.S. patent application Ser. No. 61/541,779, filed on Sep. 30, 2011. Each of these patent applications is entitled "Electrically Conductive Membrane Pump/Transducer And Methods To Make And Use Same."

All of these above-identified patent applications are commonly assigned to the Assignee of the present invention and are hereby incorporated herein by reference in their entirety for all purposes.

TECHNICAL FIELD

The present invention relates to loudspeakers, and in particular to loudspeakers having an array of electrically conductive membrane transducers (such as polyester-metal or graphene membrane pumps). The array of electrically conductive membrane transducers combine to generate the desired sound by the use of pressurized airflow.

BACKGROUND

Conventional audio speakers compress/heat and rarify/cool air (thus creating sound waves) using mechanical motion of a cone-shaped membrane at the same frequency as the audio frequency. Most cone speakers convert less than 10% of their electrical input energy into audio energy. These speakers are also bulky in part because large enclosures are used to muffle the sound radiating from the backside of the cone (which is out of phase with the front-facing audio waves). Cone speakers also depend on mechanical resonance; a large "woofer" speaker does not efficiently produce high frequency sounds, and a small "tweeter" speaker does not efficiently produce low frequency sounds.

Thermoacoustic (TA) speakers use heating elements to periodically heat air to produce sound waves. TA speakers do not need large enclosures or depend on mechanical resonance like cone speakers. However, TA speakers are terribly inefficient, converting well under 1% of their electrical input into audio waves.

The present invention relates to an improved loudspeaker that includes an array of electrically conductive membrane transducers such as, for example, an array of polyester-metal membrane pumps.

Graphene membranes (also otherwise referred to as "graphene drums") have been manufactured using a process such as disclosed in Lee et al. Science, 2008, 321, 385-388. PCT Patent Appl. No. PCT/US09/59266 (Pinkerton) described tunneling current switch assemblies having graphene drums (with graphene drums generally having a diameter between about 500 nm and about 1500 nm). PCT Patent Appl. No. PCT/US11/55167 (Pinkerton et al.) and PCT Patent Appl. No. PCT/US 11/66497 (Everett et al.) further describe switch assemblies having graphene drums. PCT Patent Appl. No. PCT/US 11/23618 (Pinkerton) described a graphene-drum pump and engine system.

FIGS. 1-5 are figures that have been reproduced from FIGS. 27-32 of the Pinkerton '615 application. As set forth in the Pinkerton '615 application.

FIGS. 1A-1E depict an electrically conductive membrane pump/transducer 100 that, like the pump/transducer 2600 (in FIG. 26 of Pinkerton '615 application), utilizes an array of electrically conductive membrane pumps that cause a membrane 102 to move in phase. FIGS. 1A-1B are cross-sectional views of the pump/transducer that includes electrically conductive members 101 (in the electrically conductive membrane pumps) and a speaker membrane 102. Speaker membrane 102 can be made of a polymer, such as PDMS. Each of the electrically conductive membrane pumps has a membrane 101 that can deflect toward downward and upwards. Traces 105 are a metal (like copper, tungsten, or gold). The electrically conductive membrane pumps also have a structural material 103 (which can be plastic, FR4 (circuit board material), or Kapton) and support material 104 that is an electrical insulator (like oxide, FR4, or Kapton). Support material 104 can be used to support the pump membrane, support the stator and also serve as the vent structure. Integrating these functions into one element makes device 100 more compact than it would be with multiple elements performing these functions. All of the non-membrane elements shown in FIG. 1A-1E can be made from printed circuit boards or die stamped sheets, which enhances manufacturability.

Arrows 106 and 107 show the direction of fluid flow (i.e., air flow) in the pump/transducer 100. When the electrically conductive membranes 101 are deflected downward (as shown in FIG. 1A), air will flow out of the pump/transducer device 100 (from the electrically conductive membrane pumps) as shown by arrows 106. Air will also flow from the cavity 108 into the electrically conductive membrane pumps as shown by arrows 107 resulting in speaker membrane 102 moving downward. When the electrically conductive membranes 101 are deflected upwards (as shown in FIG. 1B), air will flow into the pump/transducer device 100 (into the electrically conductive membrane pumps) as shown by arrows 106. Air will also flow into the cavity 108 from the electrically conductive membrane pumps as shown by arrows 107 resulting in speaker membrane 102 moving upward.

FIG. 1C is an overhead view of pump/transducer device 100. Line 109 reflects the cross-section that is the viewpoint of cross-sectional views of FIGS. 1A-1B. FIGS. 1D-1E shows the flow of air (arrows 107 and 106, respectively) corresponding to the deflection downward of electrically conductive membranes 101 and speaker membrane 102 (which is shown in FIG. 1A). The direction of arrows 107 and 106 in FIGS. 1D-1E, respectively, are reversed when the deflection is upward (which is shown in FIG. 1B).

The basic operation for pump/transducer 100 is as follows. A time-varying stator voltage causes the pump membranes 101 to move and create pressure changes within the speaker chamber 108. These pressure changes cause the speaker membrane 102 to move in synch with the pump membranes 101. This speaker membrane motion produces audible sound.

The ability to stack pumps in a compact way greatly increases the total audio power. Such a pump/transducer stacked system 200 is shown in FIG. 2.

For the embodiments of the present invention shown in FIGS. 1A-1E and 2, the individual pump membranes 101 can be smaller or larger than the speaker membrane 102 and still obtain good performance.

Pump/transducer system 100 (as well as pump/transducer speaker stacked system 200) can operate at higher audio frequencies due to axial symmetry (symmetrical with respect to the speaker membrane 102 center). Each membrane pump is approximately the same distance from the speaker membrane 102 which minimizes the time delay between pump membrane motion and speaker membrane motion (due to the speed of sound) which in turn allows the pumps to operate at higher pumping/audio frequencies.

It also means that pressure waves from each membrane pump 101 arrive at the speaker membrane 102 at about the same time. Otherwise, an audio system could produce pressure waves that are out of synch (due to the difference in distance between each pump and the speaker membrane) and thus these waves can partially cancel (lowering audio power) at certain pumping/audio frequencies.

Pump/transducer system 100 (as well as pump/transducer speaker stacked system 200) further exhibit increased audio power. Since all the air enters/exits from the sides of the membrane pump, these pumps can be easily stacked (such as shown in FIG. 2) to significantly increase sound power. Increasing the number of pump stacks (also referred to "pump cards") from one to four (as shown in FIG. 2) increases audio power by approximately a factor of 16 As can be seen in FIG. 2, the gas within the chamber is sealed by the membrane pump membranes and the speaker membrane. The gas in the sealed chamber can be air or another gas such as sulfur hexafluoride that can withstand higher membrane pump voltages than air.

Audio output is approximately linear with electrical input (resulting in simpler/cheaper electronics/sensors). Another advantage of the design of pump/transducer 100 is the way the pump membranes 101 are charged relative to the gates/stators. Applicant refers to these as "stators" since the term "gate" implies electrical switching. Pump/transducers have a low resistance membrane and the force between the stator and membrane is always attractive. This force also varies as the inverse square of the distance between the pump membrane and stator (and this characteristic can cause the audio output to be nonlinear/distorted with respect to the electrical input). The membrane can also go into "runaway" mode and crash into the stator. Thus, in practice, the amplitude of the membrane in pump/transducer is limited to less than half of its maximum travel (which lowers pumping speed and audio power).

The issues resulting from non-linear operation are solved in the design of pump/transducer 100 by using a high resistance membrane (preferably a polymer film like Mylar with a small amount of metal vapor deposited on its surface) that is charged by a DC voltage and applying AC voltages to both stators (one stator has an AC voltage that is 180 degrees out of phase with the other stator). A high value resistor (on the order of $10^8$ ohms) may also be placed between the high resistance membrane (on the order of $10^6$ to $10^{12}$ ohms per square) and the source of DC voltage to make sure the charge on the membrane remains constant (with respect to audio frequencies).

Because the pump membrane 101 has relatively high resistance (though low enough to allow it to be charged in several seconds) the electric field between one stator and the other can penetrate the charged membrane. The charges on the membrane interact with the electric field between stator traces to produce a force. Since the electric field from the stators does not vary as the membrane moves (for a given stator voltage) and the total charge on the membrane remains constant, the force on the membrane is constant (for a give stator voltage) at all membrane positions (thus eliminating the runaway condition and allowing the membrane to move within its full range of travel). The electrostatic force (which is approximately independent of pump membrane position) on the membrane increases linearly with the electric field of the stators (which in turn is proportional to the voltage applied to the stators) and as a result the pump membrane motion (and also the speaker membrane 102 that is being driven by the pumping action of the pump membrane 101) is linear with stator input voltage. This linear link between stator voltage and pump membrane motion (and thus speaker membrane motion) enables a music voltage signal to be routed directly into the stators to produce high quality (low distortion) music.

FIG. 3 depicts an electrically conductive membrane pump/transducer 300 that is similar to the pump/transducers 100 (and 2900 of FIG. 29 of Pinkerton '615 application), in that it utilizes an array of electrically conductive membrane pumps. Pump/transducer 300 does not utilize a speaker membrane (such as in pump/transducer 100) or a structure in place of the speaker membrane (such as in pump/transducer 2900 of FIG. 29 of Pinkerton '615 application). Pump/transducer 300 produces substantial sound even without a speaker membrane. Applicant believes the reason that there is still good sound power is that the membrane pumps are compressing the air as it makes its way out of the inner vents (increasing the pressure of an time-varying air stream increases its audio power). Arrows 301 show the flow of air through the inner vents. The pump/transducer 300 has a chamber that receives airflow 301 and this airflow exhausts out the chamber by passing through the open area (the chamber exhaust area) at the top of the chamber. In order to produce substantial sound the total area of the membrane pumps must be at least 10 times larger than the chamber exhaust area.

FIG. 3 also shows an alternate vent configuration that has holes 303 in the stators that allow air to flow to separate vent layers. The cross-sectional airflow area of the vents (through which the air flow is shown by arrows 301) is much smaller than the pump membrane area (so that the air is compressed). FIG. 3 also shows how a simple housing 304 can direct the desired sound 305 toward the listener (up as shown in FIG. 3) and the undesired out of phase sound away from the listener (down as shown in FIG. 3). The desired sound 305 is in the low sub-woofer range to mid-range (20 Hz to about 3000 Hz).

FIG. 4 depicts an electrically conductive membrane pump/transducer 400 that is the pump/transducer 300 that also includes an electrostatic speaker 401 (which operates as a "tweeter"). An electrostatic speaker is a speaker design in which sound is generated by the force exerted on a membrane suspended in an electrostatic field. The desired sound 402 from the electrostatic speakers 401 is in a frequency in the range of around 2 to 20 KHz (generally considered to be the upper limit of human hearing). Accordingly, pump/transducer 400 is a combination system that includes a low/mid-range speaker and a tweeter speaker.

FIG. 5 depicts an electrically conductive membrane pump/transducer 500 that is the pump/transducer 400 that further includes the speaker membrane 502 (such as in pump/transducer 100).

SUMMARY OF THE INVENTION

The present invention relates to a loudspeaker having pump cards that each include an array of electrically conductive membrane transducers (such as polyester-metal membrane pumps). The array of electrically conductive membrane transducers combine to generate the desired sound by the use of pressurized airflow.

In general, in one aspect, the invention features a loudspeaker system that includes a stack including a plurality of electrostatic audio drivers. Each electrostatic audio driver in the plurality of electrostatic audio drivers includes an electrically conductive membrane that is capable of moving along a first axis. The stack includes a first face. Air is capable of entering and exiting the first face along a second axis. The first axis and second axis are substantially perpendicular.

In general, in another aspect, the invention features a loudspeaker system that includes a stack including a plurality of electrostatic audio drivers. The stack includes a first face, a first side, a second face, and a second side. The first face has a first face area that is at least three times larger than a first side area of the first side. The second face has a second face area that is at least three times larger than a second side area of the second side.

In general, in another aspect, the invention features a loudspeaker system that includes a stack. The stack includes a plurality of electrostatic membrane pumps. The electrostatic membrane pumps include a total membrane area that equals a first total area. The stack has a first face that has a first face area. The first total area is at least five times the first face area.

Implementations of the loudspeaker systems discussed above and disclosed herein can include one or more of the following features:

The loudspeaker system can further include at least one electrodynamic loudspeaker capable of being used to produce audio frequencies above 150 Hz.

The first face can be an audio baffle.

The loudspeaker system can further include an inverter that includes inverter transistors and gates. The inverter pulses the gates of the inverter transistors for short time durations at voltage levels near the turn-on threshold of the transistors and within the linear operation region of the transistors.

The loudspeaker system can further include a neutral point clamped inverter.

The loudspeaker system can further include an inverter that operates in excess of 1000 volts.

Each of the electrostatic audio drivers in the plurality of electrostatic audio drivers can be electrically connected with at least one electrically conductive rod.

At least one of the electrostatic audio drivers in the plurality of electrostatic audio drivers can include an integrated capacitive position sensor.

The stack can be mechanically supported by at least one moveable support.

The loudspeaker system can further include a heat sink that is thermally connected to a thermally conductive grill.

The loudspeaker system can further include an inverter that employs a dynamically variable voltage DC bus.

In general, in another aspect, the invention features a method of constructing an electrostatic audio driver. The method includes the step of forming a non-conductive vent layer including a plurality of vent fingers connected by a temporary support. The method further includes the step of forming a conductive stator. The method further includes the step of securing the vent layer to the conductive stator. The method further includes the step of removing the temporary support.

In general, in another aspect, the invention features a method of operating an audio amplifier that includes an audio amplifier DC bus with an adjustable voltage. The method includes receiving a digital audio signal input. The method further includes measuring a peak voltage of the audio signal within a time buffer period. The method further includes dynamically adjusting voltage of the audio amplifier DC bus within the time buffer period in response to the measured peak voltage.

In general, in another aspect, the invention features a loudspeaker system that includes one or more electrostatic drivers capable of being used to produce low frequency sounds in the range of 20 Hz to 150 Hz. The loudspeaker further includes one or more electrodynamic drivers capable of being used to produce high frequency sounds in the range of 150 Hz to 20 kHz.

In general, in another aspect, the invention features a method to produce sounds using a loudspeaker system. The method includes using one or more electrostatic drivers to produce low frequency sounds in the range of 20 Hz to 150 Hz. The method further includes using one or more electrodynamic drivers to produce high frequency sounds in the range of 150 Hz to 20 kHz.

In general, in another aspect, the invention features a method to manufacture a loudspeaker system that includes selecting a plurality of modular stacks. Each of the modular stacks includes a plurality of electrostatic drivers capable of being used to produce low frequency sounds in the range of 20 Hz to 150 Hz. The method further includes operatively connecting the plurality of modular stacks to each other. The method further includes operatively connecting the plurality of modular stacks to one or more electrodynamic drivers capable of being used to produce high frequency sounds in the range of 150 Hz to 20 kHz.

Implementations of the loudspeaker systems, methods to produce sounds using loudspeaker systems, and methods to manufacture loudspeaker systems discussed above and disclosed herein can include one or more of the following features:

The loudspeaker system can include a plurality of the electrostatic drivers.

The stack of the electrostatic drivers can be operably connected to an electronic component that is operable to power the stack of electrostatic drivers.

The loudspeaker system can include a stack of the electrostatic drivers.

The stack of electrostatic drivers can be positioned in the loudspeaker for use as a baffle.

The loudspeaker system can further include one or more posts. The stack of electrostatic drivers can be mounted on and electrically connected to the one or more posts.

The loudspeaker system can further include a frame member having a shape to allow airflow in the loudspeaker system.

The frame member can be a die stamped frame member that has been trimmed to allow the airflow.

The stack of the electrostatic drivers can be operable to produce a series of non-overlapping air jets.

The loudspeaker system can include a plurality of stacks of the electrostatic drivers.

The plurality of stacks of the electrostatic drivers can include at least 6 stacks of the electrostatic drivers.

The plurality of stacks of the electrostatic drivers can include at least 9 stacks of the electrostatic drivers.

The plurality of stacks of the electrostatic drivers can be operably connected to an electronic component.

The electronic component can be operable to power the stack of electrostatic drivers.

At least one stack of the plurality of stacks of the electrostatic drivers can be positioned to allow airflow from the one stack.

The airflow can be operable to cool the electronic component.

The stacks of the electrostatic drivers in the plurality of stacks of the electrostatic drivers can be substantially identical.

At least one of the one or more electrostatic drivers can include an integrated position sensor.

At least one of the one or more electrostatic drivers can include an integrated velocity sensor.

The loudspeaker system can have a face area. The loudspeaker can include a stack of the electrostatic drivers. Each of the electrostatic drivers in the stack of electrostatic drivers can include a membrane. The electrostatic drivers in the stack of the electrostatic drivers can have a total membrane area that is at least five times larger than the face area of the loudspeaker system.

At least of the one or more electrostatic drivers can include a membrane that is operable to produce a time-varying airflow substantially perpendicular to the motion of the membrane.

The loudspeaker system can further include a solid-state inverter operatively connected to and operatively directly powering at least some of the one or more the electrostatic drivers.

The method of manufacturing can further include operatively connecting the plurality of modular stacks and the electrodynamic drivers to one or more electronic component.

The one or more electronic components can include an electronic component selected from the group consisting of a power invertor, an integrated position sensor, and an integrated velocity sensor.

DESCRIPTION OF DRAWINGS

FIGS. 1A-1E (which are reproduced from Pinkerton '615 application) depict an electrically conductive membrane pump/transducer that utilizes an array of electrically conductive membrane pumps that cause a membrane to move in phase. FIGS. 1A-1B depict cross-section views of the pump/transducer. FIGS. 1C-1E depict overhead views of the pump/transducer.

FIG. 12B is a magnified view of a portion of the exploded view of the pump card illustrated in FIG. 12A.

DETAILED DESCRIPTION

Loudspeaker Drivers

It has been discovered that a loudspeaker having pump cards can generate good sound without the need for a rubber/PDMS membrane and that the use of a rubber/PDMS membrane can be avoided. It has further been discovered that using pump/driver cards to move air to/from the back of the device to the front (or front and side) of the device yields much less of a pressure drop than directing airflow toward a central chamber. By doing so, the pump cards are more efficient at low audio frequencies (20 Hz to 150 Hz) than higher frequencies (150 Hz to 20 kHz); accordingly, the embodiment of the present invention implements conventional electro-dynamic cone drivers above about 150 Hz. This was surprising as this exactly the opposite of what is taught in the art and sold commercially, which teaches that all electrostatic speakers using electro-dynamic cone drivers use them to handle low frequencies and electrostatic drivers to handle mid to high frequencies).

Inverters

It was also discovered that powering the pump cards through a transformer (to boost the voltage from approximately 20 volts to +/−2 kV) below 150 Hz is inefficient; accordingly, the pump cards are driven directly with a +/−2 kV inverter. An improved switching method for this inverter is much more efficient that standard switching approaches.

A very high voltage digital audio amplifier, achieving greater than +/−2 kV, is implemented without the use of transformers or inductors using a multilevel neutral point clamped inverter topology and a novel control method. The control method involves operating the transistors of the inverter in a pseudo-linear, discrete pulsed mode with voltage feedback sensing to achieve the desired output waveform.

Figure 6:
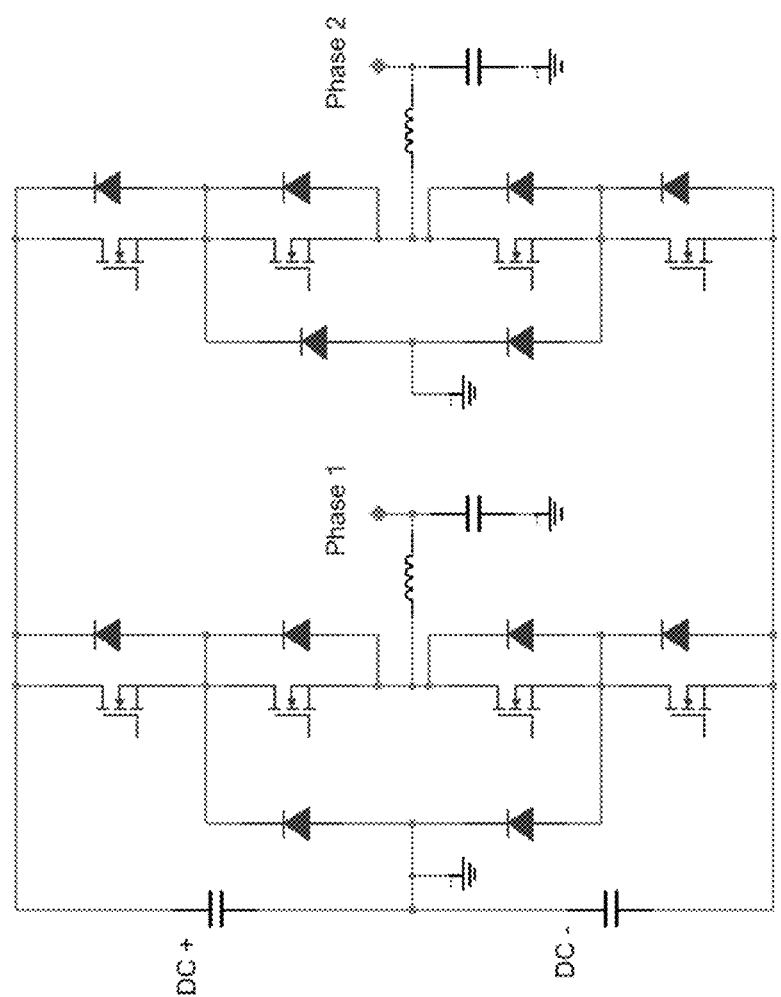
FIG. 6 is a circuit diagram of a two-phase, multilevel, neutral point clamped inverter composed of four transistors per phase, with neutral clamping diodes.

FIG. 6 shows a two-phase, multilevel, neutral point clamped inverter composed of four transistors per phase, with neutral clamping diodes, which ensure that no single transistor is exposed to more than ½ of the total DC bus voltage while in its off state. For example, this allows 1200 Volt rated transistors to be operated in a +/−2000 Volt DC bus environment. The output of the inverter is formed by an LC filter on each phase. Traditional control methods involve switching the input of the LC filter to either DC rail or to the neutral rail at high frequencies using pulse width modulation of the transistor gate inputs. The transistors are operated in their saturation mode creating high frequency rail to rail waveforms that are filtered by the LC filter to produce smooth waveforms at the output. The primary areas of concern with this mode of operation are: (a) the high switching losses in the transistors that occur while the devices transition in to and out of saturation; (b) the turn off voltage spikes due to the filter inductors (making it unsafe to operate the transistors near their maximum voltage rating); and (c) high losses in the inductors due the high frequency ripple current.

It should be noted that each phase of the of the inverter requires three floating, isolated gate power supplies and one isolated gate power supply referenced to the negative DC rail. These supply an isolated signaling device (e.g., an optocoupler). The signaling device is most easily operated with a discrete level digital pulse of a variable time duration.

The new control method involves pulsing the gates of the transistors for short time durations at voltage levels near the turn on threshold of the devices (within the linear operation region of the transistors). The pulses occur at a frequency equal to or higher than the sample rate of the audio signal. The pulses are tailored so the transistors only turn on briefly in their linear operation region and do not drive their outputs to the rails. The filter inductors are removed and the transistors deliver the necessary amount of current to the output capacitor to adjust its voltage the desired level for each discrete step of the audio signal. This is particularly effective when the load attached to the inverter is itself highly capacitive, as in an electrostatic loudspeaker or electrostatic pump/driver card stack. With minor adjustments to the gate circuitry and pulse timing, the desired effect can be achieved with BJTs, MOSFETS, or IGBTs. With the removal of the filter inductors, their losses are eliminated, as well as any turn off transient voltage spikes. Additionally, no freewheeling diodes are required in the circuit.

For each digital sample of the audio signal, the controller decides which transistors to operate and then applies a circuit model to predict the pulse length required for each discrete step on the output. The output voltage of each phase is sampled at a frequency equal to or above the sample rate of the audio signal and feedback adjustments are made to the pulse length algorithm for accurate tracking and low distortion.

In the loudspeaker application, one phase of the inverter is operated to directly track the audio signal, while the other is operated with the oppositely signed signal, creating a doubled voltage signal across the speaker terminals. For example, a sine wave can be generated on one phase of the inverter with an amplitude of +/−1000 V, or 2000 V peak to peak. The oppositely signed sine wave (which is 180 degrees phase shifted) is then generated on the other phase. The combined voltages at the speaker terminals have a peak difference of +/−2000 V, or 4000V peak to peak. Using embodiments of the present invention, this result has been achieved with multiple types of 1200V rated transistors.

Dynamic DC Bus Controller

As reflected above, the inverters in the present invention utilize power amplitudes in the kV range (as compared to the inverters encountered for standard loudspeaker applications, which are generally in a range around 10-25 V). By definition, inverters (including switching amplifiers) require one or more DC power supplies to establish voltage rails that the switching elements can alternatively select to create the desired AC output voltage. Typically, the DC supplies are controlled to a fixed level that exceeds the highest voltage that the amplifier will be required to produce at its output.

The power losses in an inverter are related to the voltage level of the DC bus, which affects the amount of voltage that will be across the inverter elements while they are switching. Additionally, there may be significant power losses in the DC power supplies, which also increase with the voltage level of the DC bus (for example boost converter switching losses and transformer/inductor losses). These power loss relationships are true for most inverter topologies, including standard class D amplifiers and the high voltage NPC inverter utilized in the loudspeaker embodiments of the present Application.

Since the power bus level must be above audio signal (i.e., inverter output), setting the bus at a preset level above this range (i.e., in the kV range) would cause significant power loss, such as due to the generation of heat and also is further particularly a problem when the DC bus is powered by a battery (such as in a device like a portable Bluetooth loudspeaker).

A typical audio signal will often have amplitude peaks that vary widely with time. Accordingly, embodiments of the present invention implement a new controller (and control process) that uses digital memory buffering to look ahead at the audio signal and predict what DC bus level will be required in the near future for the inverter output to reach its required voltage. This time of look ahead is generally variable. However, if the look ahead time is too quick, there is a problem that the DC bus level may not respond properly. If the look ahead time is too slow, there is a problem since the DC bus level will generally remain higher than necessary. In some embodiments, it has been discovered that a look ahead of around 0.4 to 0.6 milliseconds and generally around 0.5 milliseconds provides the proper response.

The DC bus level can be controlled by a dynamic DC bus controller utilizing a field-programmable gate array ("FPGA") (such as from Altera Corporation, San Jose, Calif.) or a digital signal processor ("DSP") (such as from Texas Instruments Incorporated, Dallas, Tex.). The parameters of the FPGA (or the DSP) in the dynamic DC bus controller can be adjusted to lead the inverter output by the necessary amount for the DC bus to reach the new level at the appropriate time. When the dynamic DC bus controller determines that the future peaks in the audio signal will be below the operating point of the DC bus, the bus can be dynamically lowered to reduced levels (i.e., a "dynamic DC bus" and also a "dynamically variable voltage DC bus"). This allows the dynamic DC bus controller to reduce the average operating voltage of the dynamic DC bus and therefore lower the average losses of the inverter. Such reduction can be more than half the average losses of the inverter (and typically a third or more), as compared to utilizing a DC bus that is set at a particular level (i.e., not varied).

This dynamic DC bus control method can be used in a relatively slow fashion to vary the DC bus according to the overall ebb and flow of the musical dynamics, or it can be used in an aggressive fashion to vary the DC bus level in between the individual peaks of audio signals.

Figure 7:
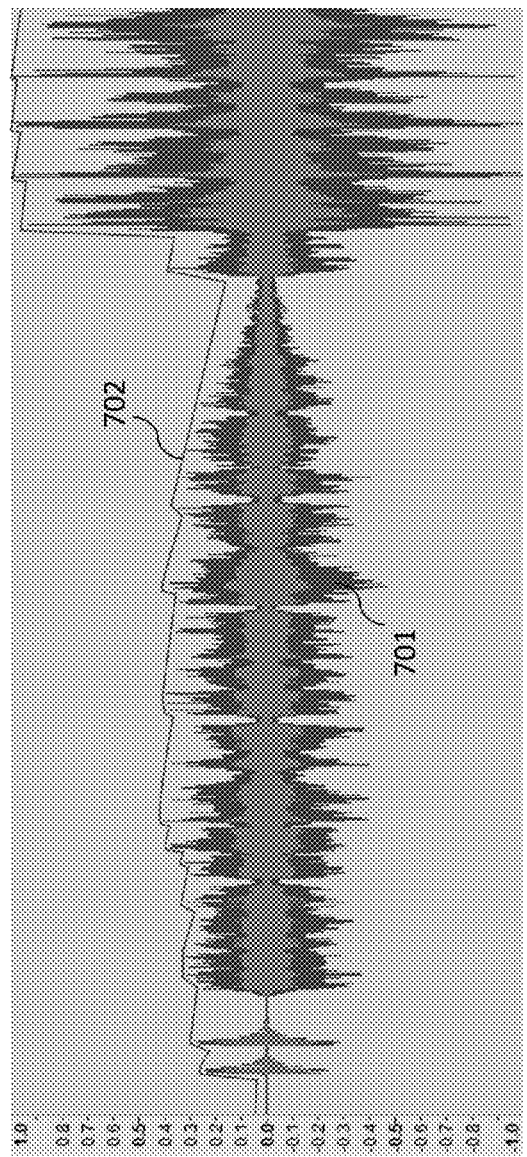
FIG. 7 is a graph showing a comparison of the inverter output (audio signal) and the level of a dynamic DC bus for a song using a loudspeaker embodiment of the present invention (for a song sample size of 30 seconds).

FIG. 7 is a graph showing a comparison of the inverter output (audio signal) 701 and the dynamic DC bus level 702 in a slow control mode for a song sample size of 30 seconds.

Figure 8:
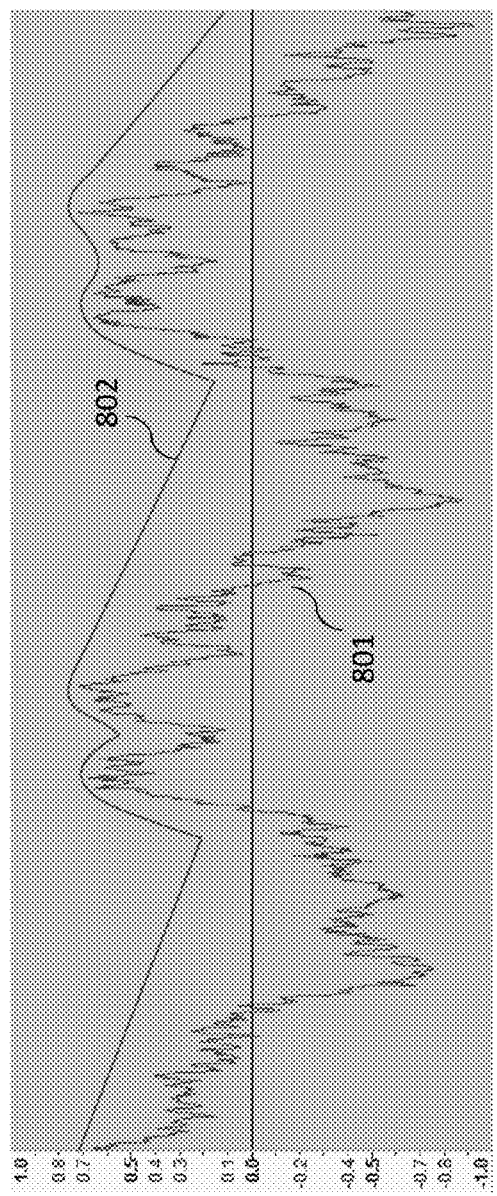
FIG. 8 is a graph showing a comparison of the inverter output (audio signal) and the level of a dynamic DC bus for a song when using another loudspeaker embodiment of the present invention (for a song sample size of 50 milliseconds).

FIG. 8 is a graph showing a comparison of the inverter output (audio signal) 802 and the dynamic DC bus level 802 in an aggressive control mode for a song sample size of 50 milliseconds.

This dynamic DC bus control method can greatly reduce the average power losses of the inverter, which is critical for runtime in battery-powered systems. Reducing the power losses can also greatly affect the thermal load of the system, potentially increasing its overall power handling ability.

Loudspeaker Package

In the present invention, an effective way to mitigate the undesired 180 degree sound signal (that results from the air that is drawn into the pump/driver cards at the same time that air is pushed out of the pump cards) is to block the 180 sound with the device itself (i.e., use the device as a baffle). This yields a device package that has a large face area relative to its thickness.

Another advantage of the present invention is that both the metal and plastic parts used in the pump/driver cards can be fabricated by die stamping (and then trimming the plastic parts after the pump cards are assembled).

The present invention also includes a manner in which hundreds of electrical connections to the pump cards can be handled in a compact and low cost fashion. This includes creating modular "card stacks" that can be used to create a number of different products with one standard building block.

Loudspeaker Designs

Figure 9:
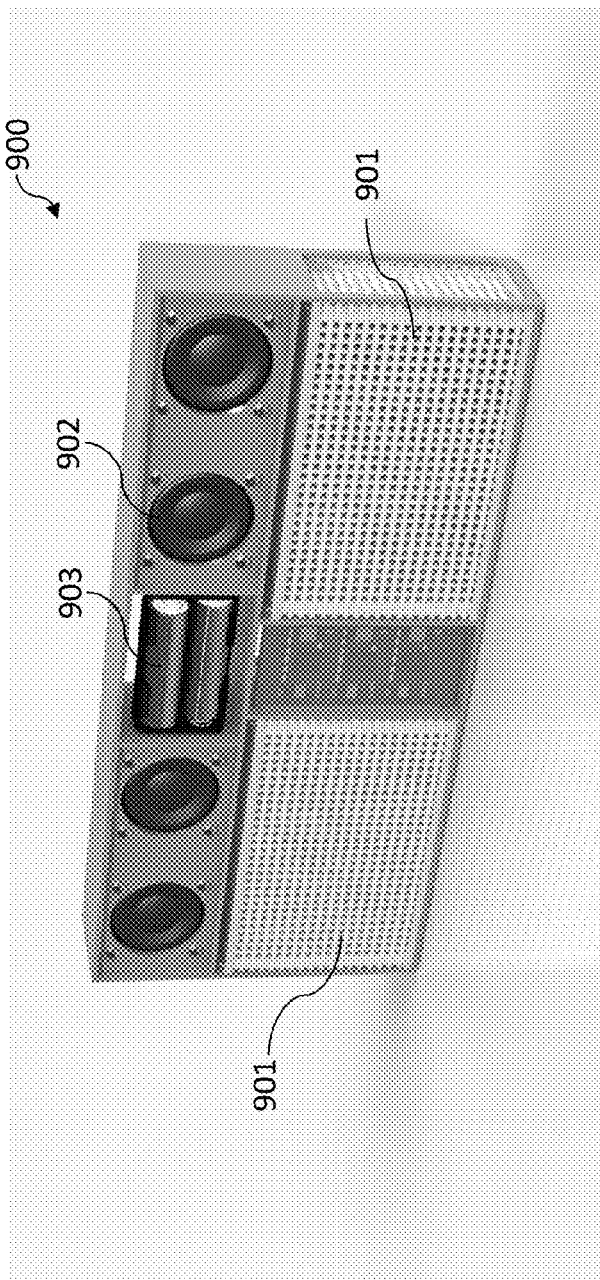
FIG. 9 illustrates a two stack device of the present invention.

Referring to FIG. 9, this figure shows a device 900 (loudspeaker) having two card stacks 901 (stacks of electrostatic drivers) and four cone drivers 902 (electrodynamic drivers). Device 900 is thin relative to its face to reduce the unwanted 180 degree signal. Air is drawn in/out from the back of device 900 and comes out/in the front/side of the device without any obstructions (i.e., there is no central chamber). Since the device is battery powered (from one or more batteries 903), efficiency is key. It has been found that a prototype device is more than 100 times more efficient at 50 Hz than several top selling bluetooth speakers.

Figure 10A:
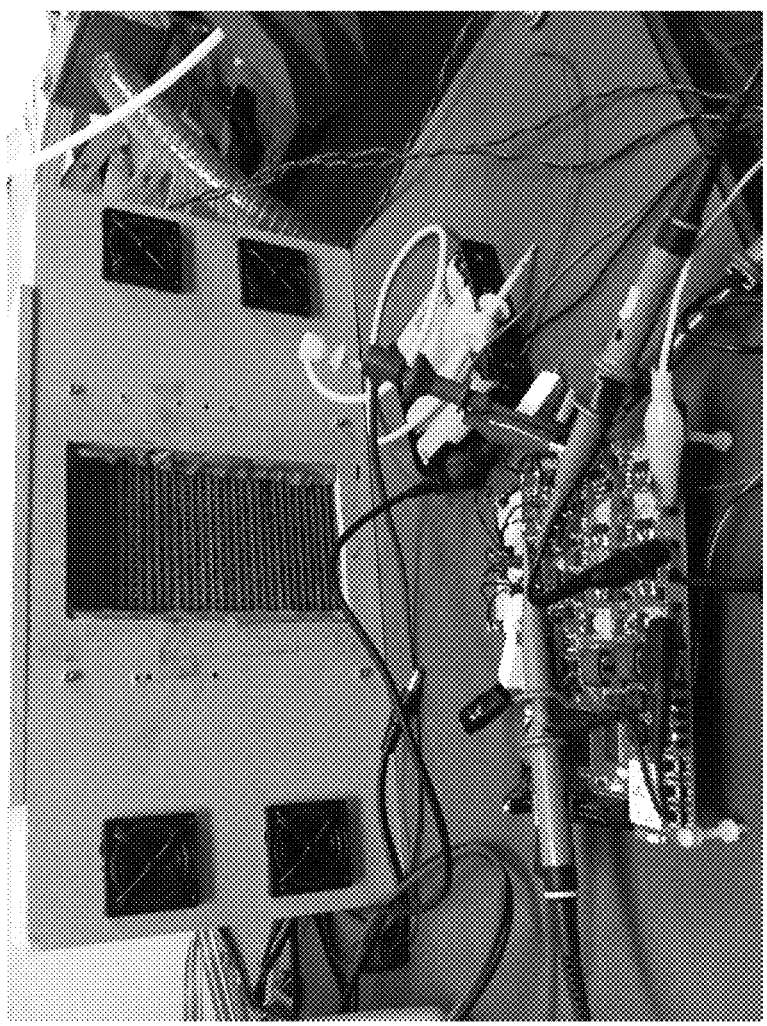
FIG. 10A is a photograph of the front of a prototype of the present invention.

FIG. 10A is a photograph of the front of the tested prototype. In this embodiment, the electronics and battery were positioned outside the housing. However, typically such electronics and battery is included within the housing.

Figure 10B:
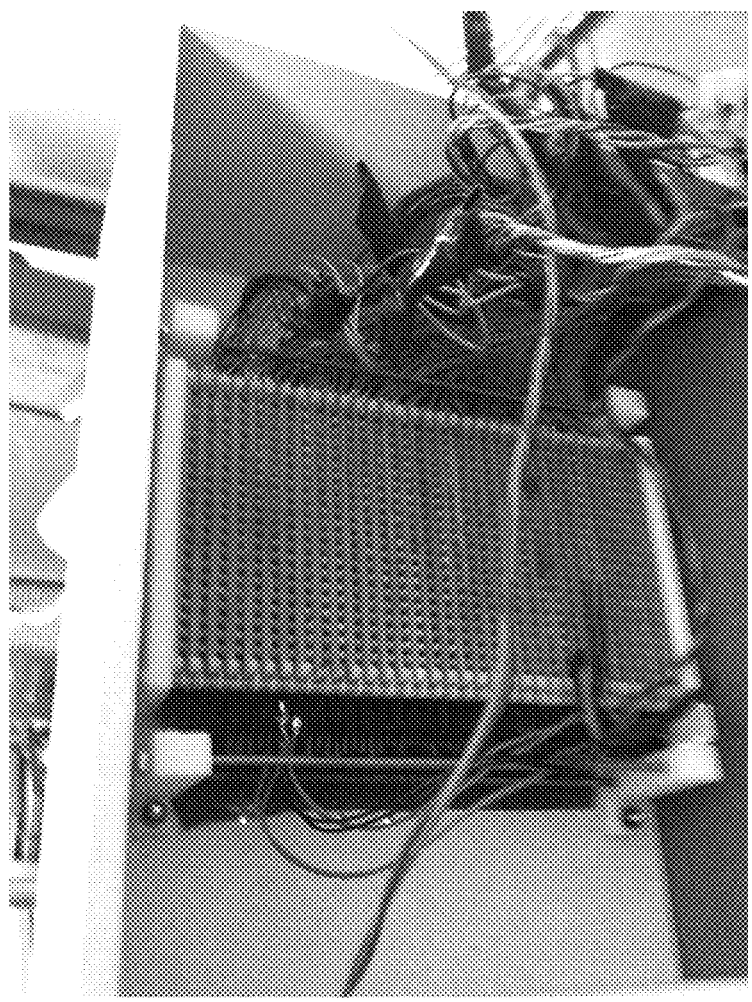
FIG. 10B is a photograph of the back of a prototype shown in FIG. 10A.

FIG. 10B is a photograph of the back side of the tested prototype. This shows that the prototype had around 65 pump/driver cards in the stack and a total of around 195 wire connections.

Figure 11:
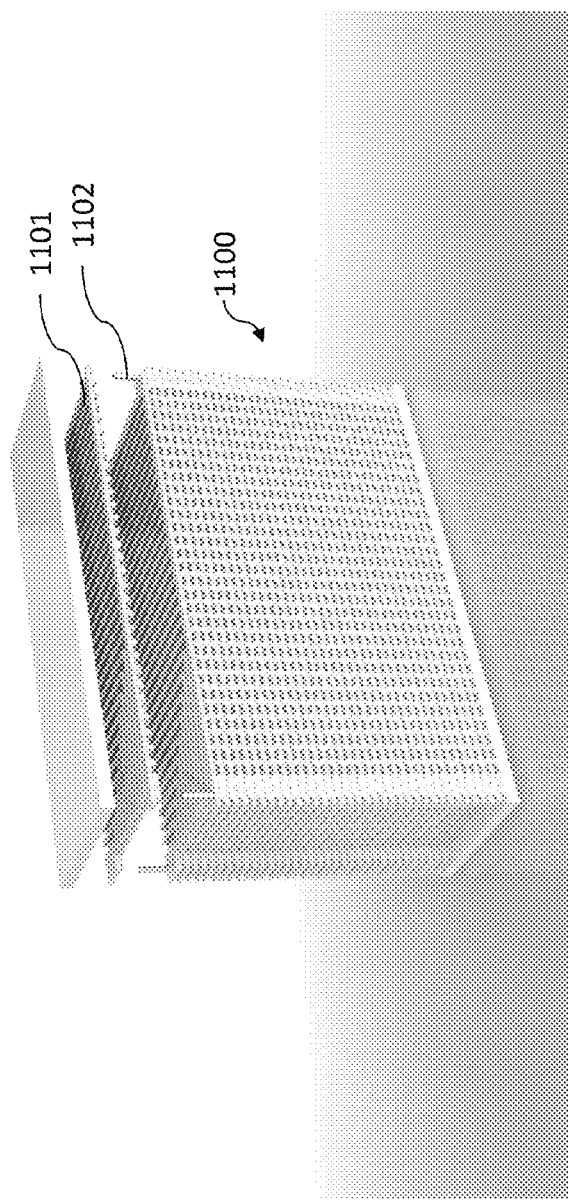
FIG. 11 is an illustration of a card stack that can be used in embodiments of the present invention.

In embodiments of the present invention, the card stack is designed such that it will automatically make the required electrical connections. In the card stack 1100 shown in FIG. 11, as the pump card 1101 is slipped on the four connection rods 1102 (made of metal or some other electrically conducting materials), these connection rods 1102 make the required electrical connections.

Figure 12A:
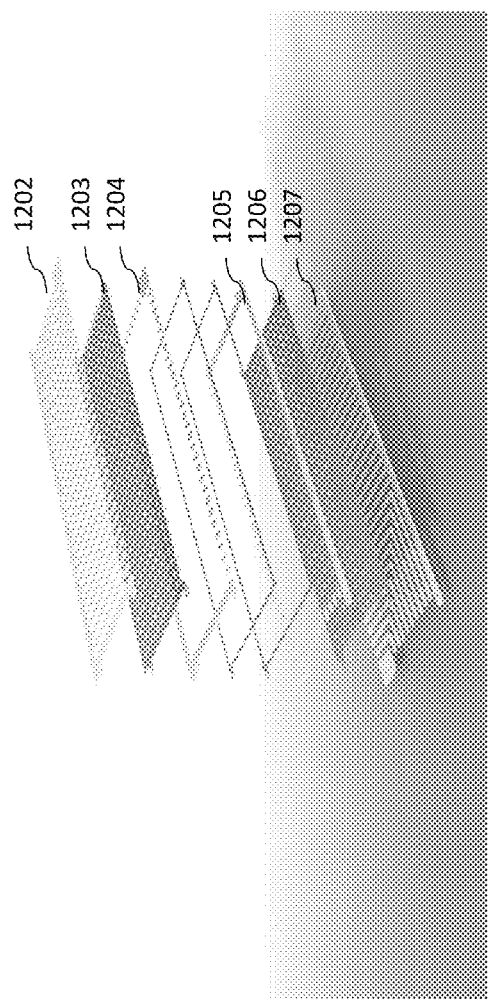
FIG. 12A is an illustration of an exploded view of a pump card that can be used in embodiments of the present invention.

FIG. 12A is an exploded view of pump card 1101 illustrating how those automatic connections work. There are little radial fingers 1201 (shown in FIG. 12B) in the metal holes that make good electrical contact with the connection rods 1102 when the pump cards 1101 are slipped on the connection rods 1102. The rods are connected to a circuit board (not shown) on the top or bottom of card stack 1100 and this circuit board routes electrical connections to inverter terminals (not shown). You can also see the stator vents 1202 and 1207 on the extreme top and bottom along with the frame vents 1204 and 1205 between the two metal stators 1203 and 1206.

Figure 13:
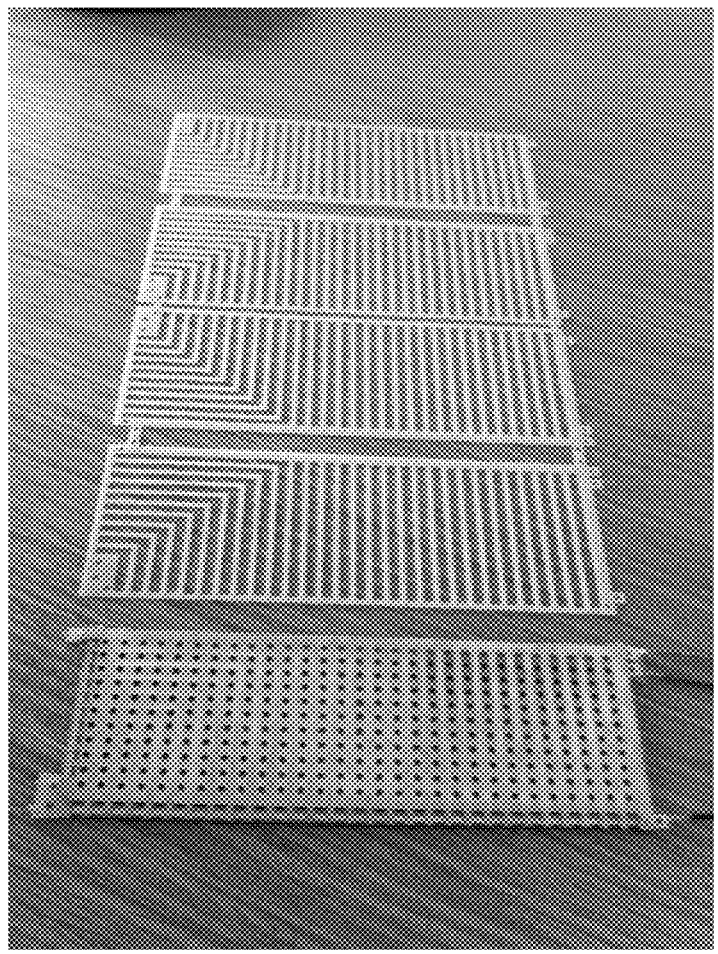
FIG. 13 is a photograph of a plastic/fiberglass stator vent assembly along with a finished pump/driver card that can be used in embodiments of the present invention.

FIG. 13 is a photograph of a plastic/fiberglass stator vent assembly (along with a finished pump/driver card) that can be made inexpensively with a die stamping process. After the pump card is partially assembled, there are parts of the vents that are cut (such as with a saw or another stamp) to open up the airflow path (which can be seen by comparing vent assembly in the completed pump/driver card).

Figure 14:
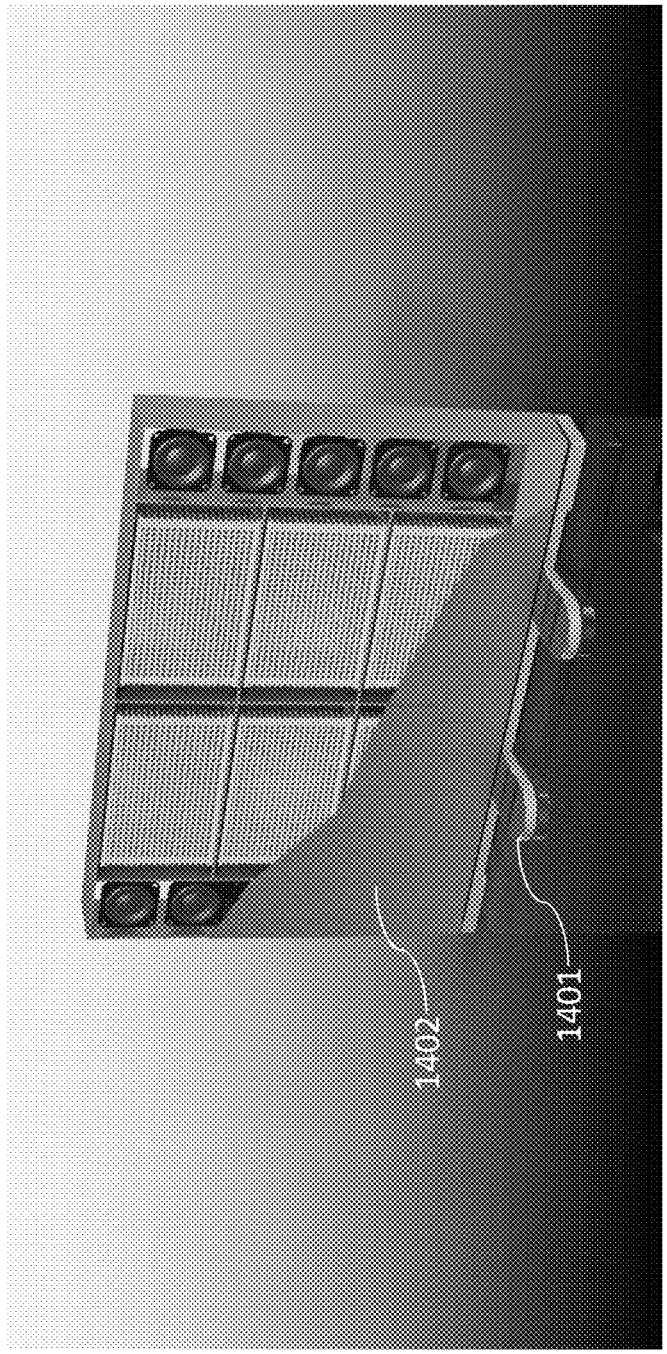
FIG. 14 illustrates a six stack device of the present invention.
Figure 15:
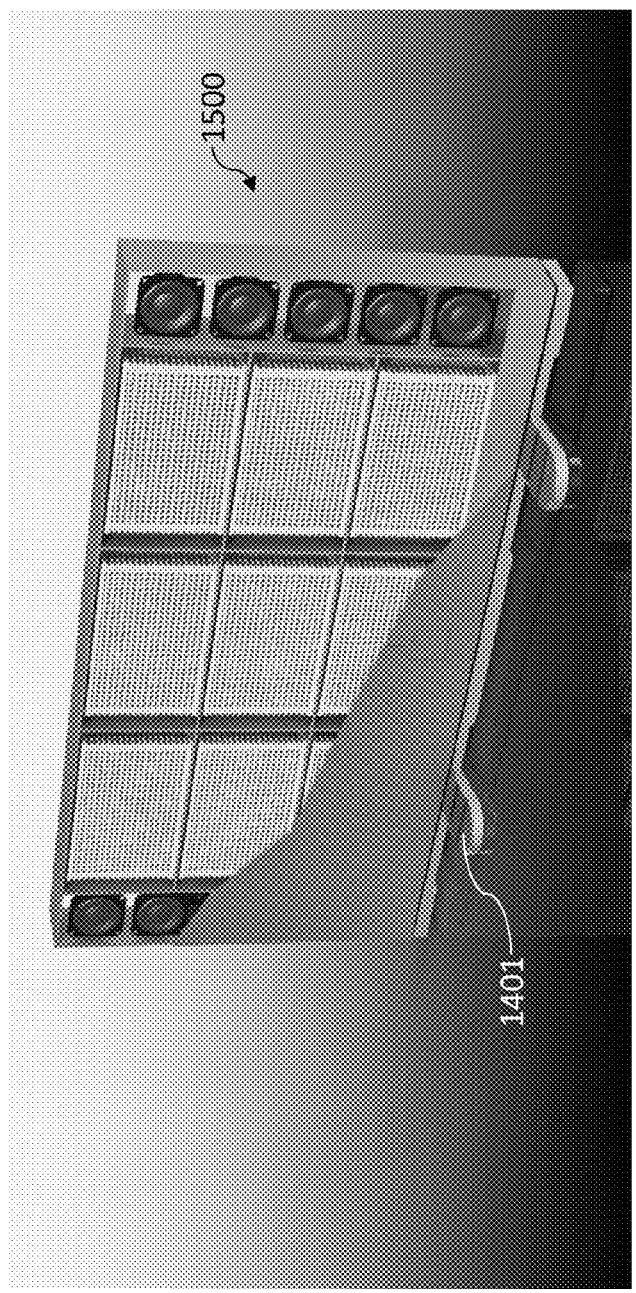
FIG. 15 illustrates a nine stack device of the present invention.

FIGS. 14-15 are illustrations showing how card stacks can be used in larger speaker products. The audio power due to airflow of these devices is proportional to the square of the number of cards stacks (the nine stack device 1500 of FIG. 15 will be about 20 times more powerful than a two stack device 900 due to increased airflow alone). Also, as the face of the speaker gets larger more of the undesired 180 signal is blocked so a nine stack device 1500 will be closer to 50 times more powerful than a two stack device 900. Small aluminum feet 1401 can be used to support the device during use but can be twisted into a more compact position for travel. Grill 1402 can be a thermally conductive grill that is thermally connected to a heat sink of the loudspeaker.

Figure 16:
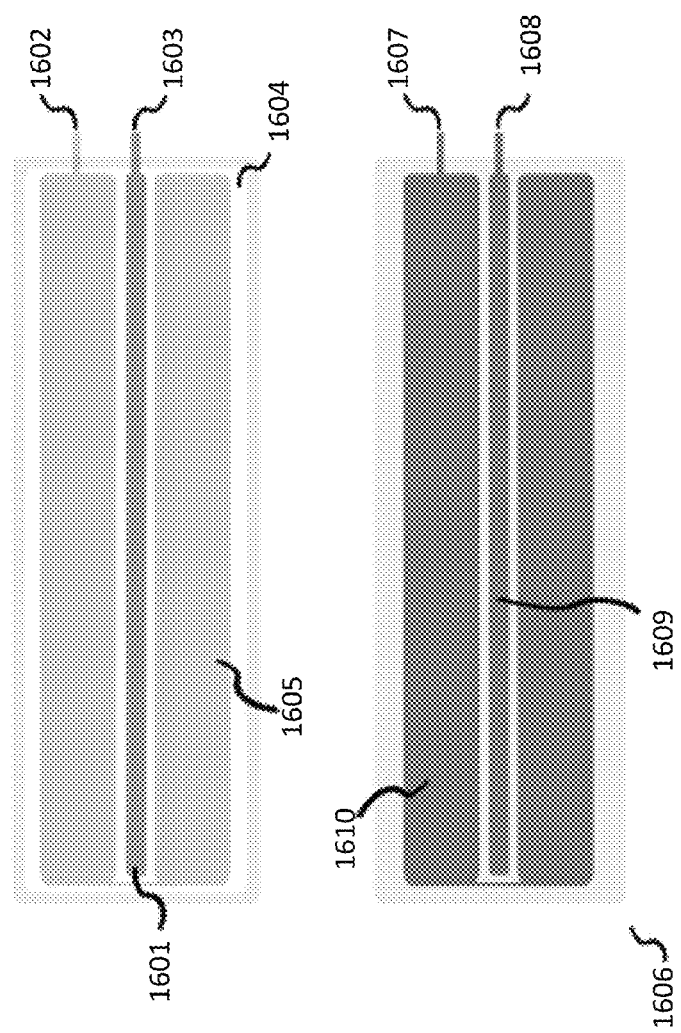
FIG. 16 illustrates a position sensor that can be integrated into a pump/driver card that can be used in embodiments of the present invention.

FIG. 16 illustrates a position sensor that can be integrated into a pump/driver card. The thin line of metal 1601 in middle of membrane 1604 is a low resistance (on the order of $10^3$ ohms per square) trace and it is connected to terminal 1603 ($T_2$). The two larger traces 1605 connected to terminal 1602 ($T_1$) are made of high resistance (on the order of $10^{10}$ ohms per square) material such as a few nanometers of vapor deposited metal or graphite. The stator 1606 has a low resistance middle trace 1609 connected to terminal 1608 ($T_4$) and another low resistance trace 1610 connected to terminal 1607 ($T_3$). Voltages applied to loudspeaker terminal 1602 ($T_1$) and terminal 1607 ($T_3$) are used to move the membrane with electric fields and charges as in the other embodiments.

To measure the position of the membrane, a high frequency (about $10^6$ Hz) signal can be applied across terminal 1603 ($T_2$) and terminal 1608 ($T_4$). As the distance between the traces 1601 and 1609 changes, the capacitance between these traces changes. This change in capacitance causes a shift in phase between the applied voltage and current of the high frequency signal. This phase shift can be used to determine the absolute position and velocity of the membrane 1604. Another way to determine membrane position is to apply a first high frequency (about $10^6$ Hz) voltage to $T_4$ and a second high frequency voltage (that is 180 degrees out of phase with the first voltage signal) to the central terminal of the other stator (not shown). When the membrane is equidistant from each stator there will be no net voltage on terminal 1603 ($T_2$) but as the membrane moves toward one stator (and thus away from the other stator) there will be a net signal on terminal 1603 ($T_2$) that can be used to determine the position of the membrane. Many of these sensors (one for each pump card) can be put in parallel to increase the change in capacitance with membrane position and thus increase the signal to noise ratio of the position sensor system.

A controller (not shown) can be used to compare the ideal position/velocity needed to create a given sound with the measured values. The time-varying voltage applied to terminal 1602 ($T_1$) and terminal 1607 ($T_3$) can then be adjusted (within microseconds) so that the membrane position and velocity are forced to be maintained close to the ideal values. This technique is especially useful for an electrostatic card pump/driver that has substantial back pressure that varies with both sound volume level and audio frequency.

Alternatively, a DC voltage can be applied between terminal 1603 ($T_2$) and terminal 1608 ($T_4$) to determine the velocity (but not position) of membrane 1604 by measuring the time-varying current (that is caused by the time-varying capacitance between traces 1601 and 1608 as the membrane moves) through a resistor that is placed in series with the DC voltage.

Figure 17:
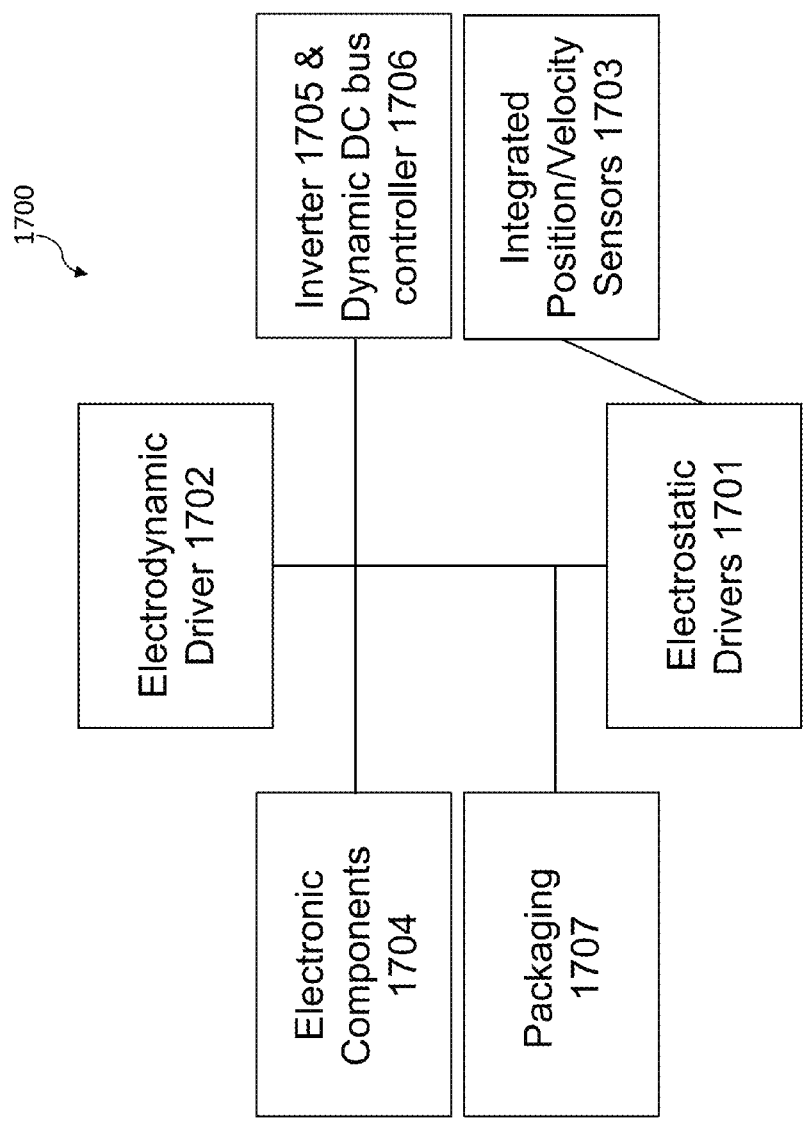
FIG. 17 is a schematic illustration of a speaker assembly of the present invention.

FIG. 17 is a schematic illustration of a loudspeaker assembly 1700. This speaker assembly includes electrostatic drivers 1701 (such as a plurality of stacks of electrostatic drivers) in combination with one or more electrodynamic drivers 1702. At least one of the electrostatic drivers 1701 includes an integrated position sensor and/or integrated velocity sensor 1703. These electrostatic drivers 1701 and electrodynamic drivers 1702 are operatively connected to various electronic components 1704, such as a processor, a controller, a power inverter (i.e., a solid-state inverter) that can connect to a power source, and an input device and/or an output device (such as a touch screen), etc. FIG. 17 identifies certain of these electronic components, namely inverter 1705 and dynamic DC bus controller 1706 separately. Loudspeaker assembly 1700 further includes packaging 1707.

Figure 1C:
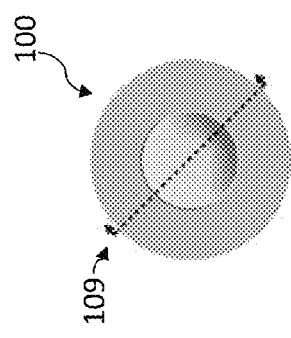
Figure 1E:
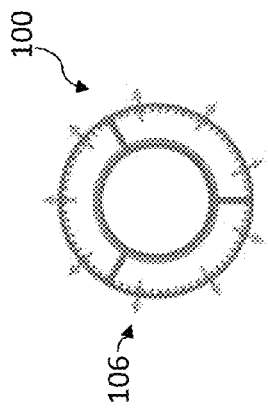
Figure 1D:
Figure 2:
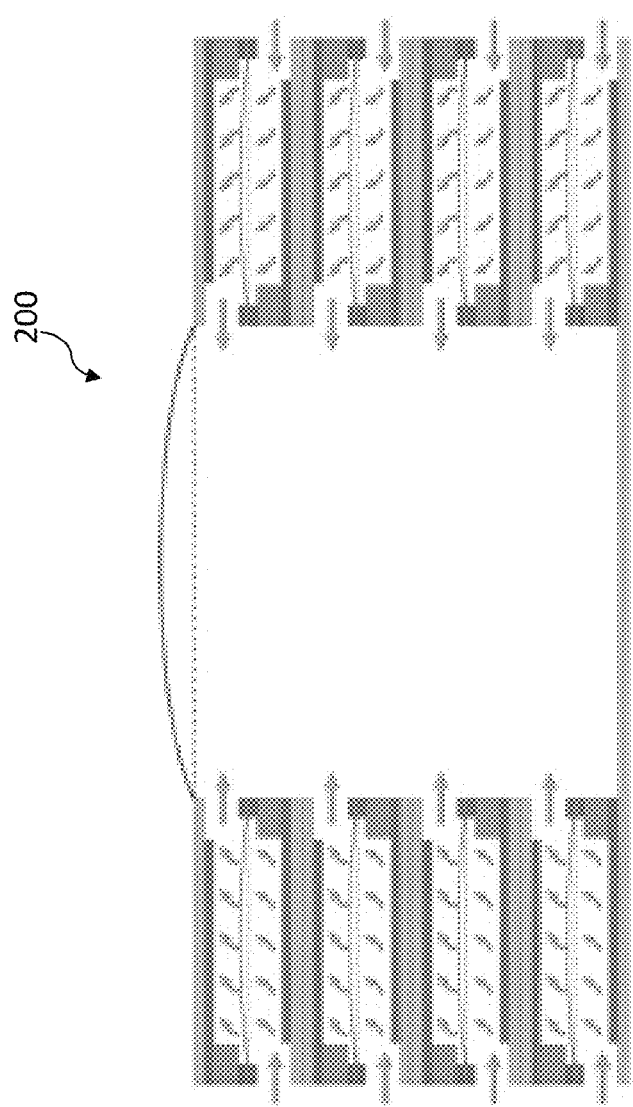
FIG. 2 (which is reproduced from Pinkerton '615 application) depicts an electrically conductive membrane pump/transducer that has a stacked array of electrically conductive membrane pumps.
Figure 3:
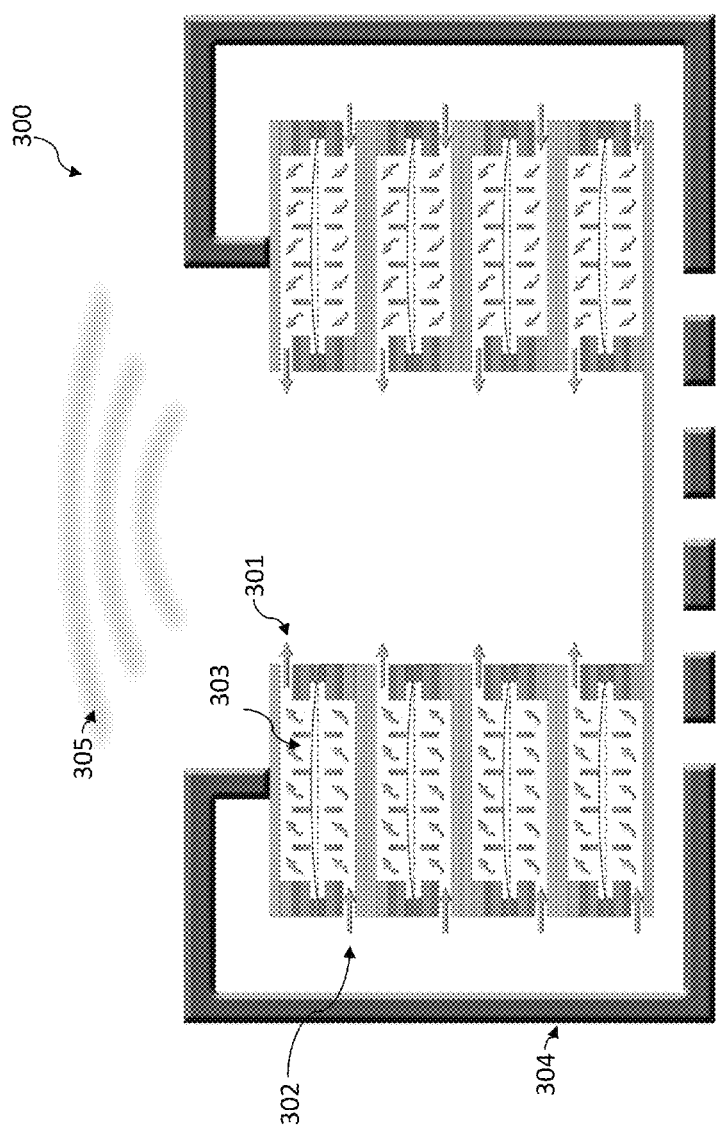
FIG. 3 (which is reproduced from Pinkerton '615 application) depicts an electrically conductive membrane pump/transducer that utilizes an array of electrically conductive membrane pumps that operates without a membrane or piston.
Figure 4:
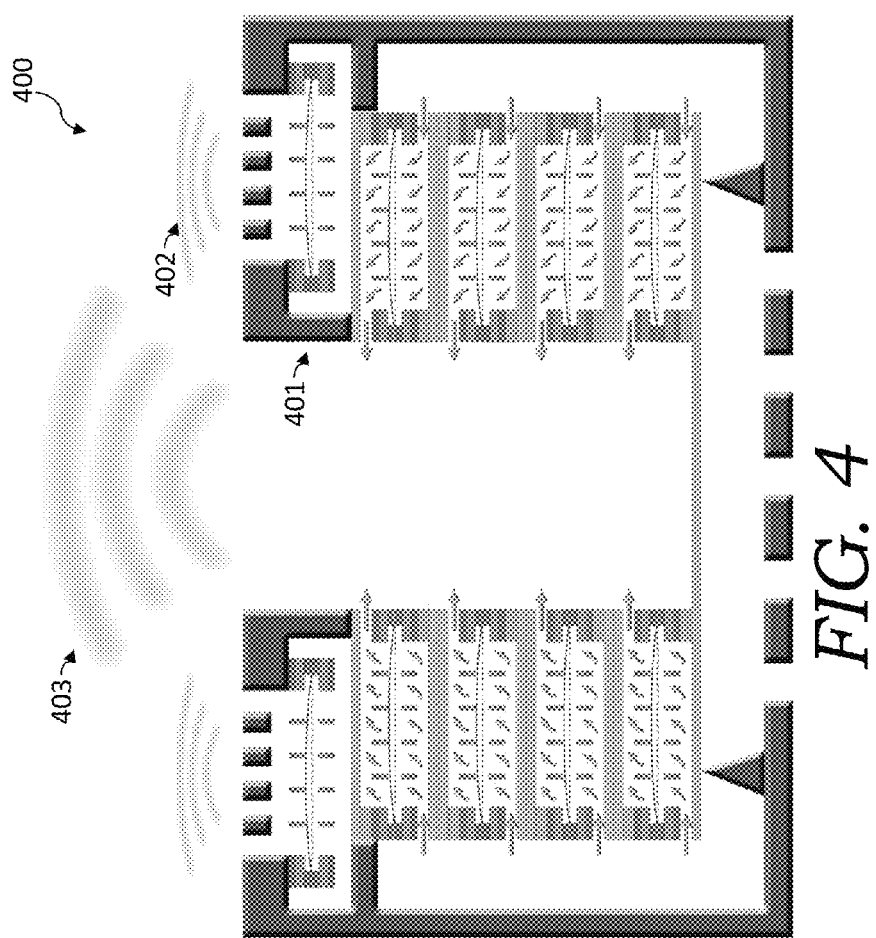
FIG. 4 (which is reproduced from Pinkerton '615 application) depicts an electrically conductive membrane pump/transducer 400 that utilizes an array of electrically conductive membrane pumps and that also includes an electrostatic speaker.
Figure 5:
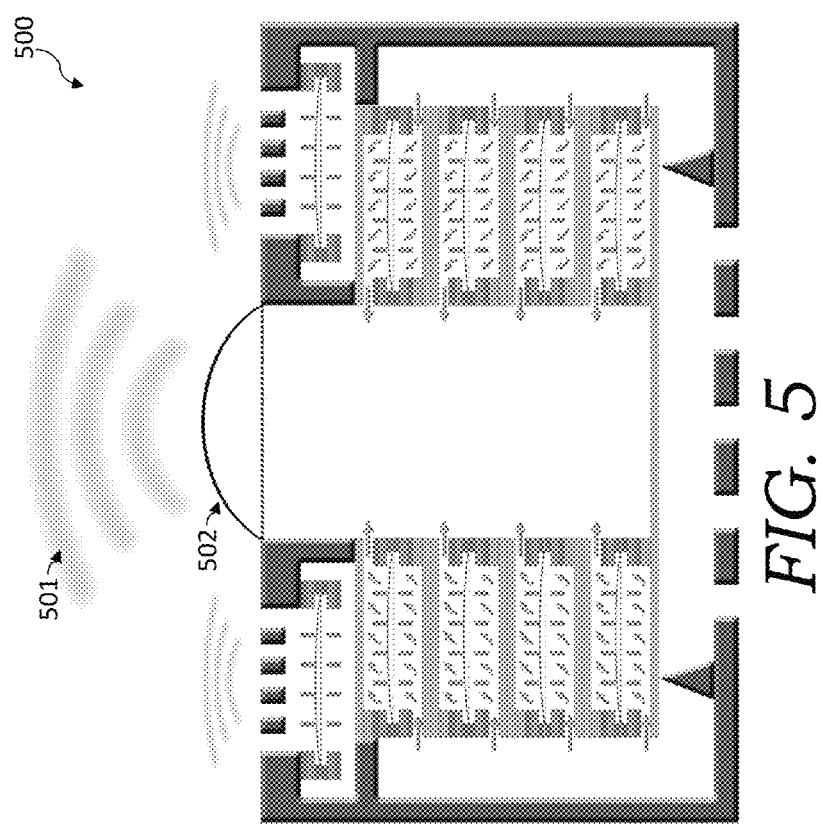
FIG. 5 (which is reproduced from Pinkerton '615 application) depicts an electrically conductive membrane pump/transducer 500 that utilizes an array of electrically conductive membrane pumps that cause a membrane to move in phase and that also includes an electrostatic speaker.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. For example, electrostatic speakers 401 shown in FIG. 4 could replace electro-dynamic cone speakers 902 in FIG. 9 to handle audio frequencies above approximately 150 Hz. Accordingly, other embodiments are within the scope of the following claims. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

What is claimed is:

1. A loudspeaker system comprising a stack comprising a plurality of electrostatic audio drivers, wherein
    (a) each electrostatic audio driver in the plurality of electrostatic audio drivers comprises an electrically conductive membrane that is capable of moving along a first axis;
    (b) the stack comprises a first face;
    (c) air is capable of entering and exiting the first face along a second axis; and
    (d) the first axis and second axis are substantially perpendicular.

2. The loudspeaker system of claim 1 further comprising at least one electrodynamic loudspeaker capable of being used to produce audio frequencies above 150 Hz.

3. The loudspeaker system of claim 1, wherein the first face is an audio baffle.

4. The loudspeaker system of claim 1 further comprising an inverter comprising inverter transistors and gates, wherein the inverter pulses the gates of the inverter transistors for short time durations at voltage levels near the turn-on threshold of the transistors and within the linear operation region of the transistors.

5. The loudspeaker system of claim 1 further comprising a neutral point clamped inverter.

6. The loudspeaker system of claim 1 further comprising an inverter that operates in excess of 1000 volts.

7. The loudspeaker system of claim 1, wherein each of the electrostatic audio drivers in the plurality of electrostatic audio drivers is electrically connected with at least one electrically conductive rod.

8. The loudspeaker system of claim 1, wherein at least one of the electrostatic audio drivers in the plurality of electrostatic audio drivers comprises an integrated capacitive position sensor.

9. The loudspeaker system of claim 1, wherein the stack is mechanically supported by at least one moveable support.

10. The loudspeaker system of claim 1 further comprising a heat sink that is thermally connected to a thermally conductive grill.

11. The loudspeaker system of claim 1 further comprising an inverter that employs a dynamically variable voltage DC bus.

* * * * *